US007914906B2

(12) United States Patent
Hung et al.

(10) Patent No.: US 7,914,906 B2
(45) Date of Patent: Mar. 29, 2011

(54) ORGANIC ELECTRO-LUMINESCENCE DEVICE

(75) Inventors: Min-Ling Hung, Pin Tung Hsien (TW); Pei-Chi Wu, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 1007 days.

(21) Appl. No.: 11/490,088

(22) Filed: Jul. 21, 2006

(65) Prior Publication Data
US 2007/0166567 A1 Jul. 19, 2007

(30) Foreign Application Priority Data
Jan. 13, 2006 (TW) .............................. 95101484 A

(51) Int. Cl.
*H01L 51/54* (2006.01)
(52) U.S. Cl. ......... 428/690; 428/917; 313/504; 313/506
(58) Field of Classification Search .................. None
See application file for complete search history.

(56) References Cited

U.S. PATENT DOCUMENTS

| | | | |
|---|---|---|---|
| 5,456,988 A | 10/1995 | Sano et al. | |
| 5,853,905 A * | 12/1998 | So et al. | 428/690 |
| 6,396,209 B1 * | 5/2002 | Kido et al. | 313/504 |
| 6,525,465 B1 * | 2/2003 | Fujita | 313/504 |
| 6,734,457 B2 * | 5/2004 | Yamazaki et al. | 257/40 |
| 2001/0053462 A1 * | 12/2001 | Mishima | 428/690 |
| 2002/0022149 A1 * | 2/2002 | Watanabe et al. | 428/690 |
| 2002/0113545 A1 * | 8/2002 | Adachi et al. | 313/504 |
| 2003/0203236 A1 * | 10/2003 | Thompson et al. | 428/690 |
| 2004/0104394 A1 * | 6/2004 | Lin et al. | 257/79 |
| 2004/0247933 A1 * | 12/2004 | Thoms | 428/690 |
| 2005/0029933 A1 * | 2/2005 | Liao et al. | 313/504 |
| 2005/0048295 A1 * | 3/2005 | Kim et al. | 428/447 |
| 2005/0072970 A1 * | 4/2005 | Saito | 257/40 |
| 2005/0084711 A1 * | 4/2005 | Sasaki et al. | 428/690 |
| 2006/0131562 A1 * | 6/2006 | Li | 257/40 |
| 2007/0126347 A1 * | 6/2007 | Jarikov et al. | 313/506 |

FOREIGN PATENT DOCUMENTS

| | | |
|---|---|---|
| TW | 588569 | 5/2004 |
| TW | 228381 B | 2/2005 |
| TW | 236174 | 7/2005 |
| TW | 242595 | 11/2005 |

* cited by examiner

*Primary Examiner* — Dawn Garrett
(74) *Attorney, Agent, or Firm* — Birch, Stewart, Kolasch & Birch, LLP

(57) ABSTRACT

An organic electro-luminescence device includes a substrate, the first electrode layer, a hole injecting layer, a hole transporting layer, a light emitting layer, an electron transporting layer, an electron injecting layer and the second electrode layer. The first electrode layer is formed over the substrate. The hole injecting layer is formed over the first electrode layer. The hole transporting layer is formed over the hole injecting layer. The light emitting layer is formed over the hole transporting layer. The electron transporting layer is formed over the light emitting layer. The electron transporting layer includes carbazole derivative and n-type material. The electron injecting layer is formed over the electron transporting layer. The second electrode layer is formed over the electron injecting layer.

17 Claims, 4 Drawing Sheets

ORGANIC ELECTRO-LUMINESCENCE DEVICE

BACKGROUND OF THE INVENTION (1) Field of the Invention

The present invention generally relates to an organic electro-luminescence device, and particularly to an organic electro-luminescence device capable of blocking the hole.

(2) Description of the Prior Art

Recently, an organic electro-luminescence device has been studied a lot in the display technology. The organic electro-luminescence device can be used for manufacturing a thin-type display. Compared to a liquid crystal display, another kind of thin-type display, the organic electro-luminescence device is self-luminous, while the liquid crystal display still needs a backlight source. Therefore, the organic electro-luminescence device is able to achieve more saturated color reproduction easily.

Please refer to FIG. 1A. FIG. 1A is a cross-sectional side view of a conventional organic electro-luminescence device 10. The organic electro-luminescence device 10 usually in order includes a substrate 11, an anode layer 13, a hole injecting layer 15, a hole transporting layer 17, a light emitting layer 19, an electron transporting layer 21, an electron injecting later 23 and a cathode layer 25.

The combination of an electron and a hole in the light emitting layer 19 transforms electric energy into photon energy. As a result, light 29 is released and emits from the bottom of the substrate 11 of the organic electro-luminescence device 10. However, in this type of organic electro-luminescence device 10, the hole passes through the electron transporting layer 21 and moves toward the cathode layer 25. Therefore, the electron and the hole can not combine effectively in the light emitting layer 19, and the energy is wasted.

Please refer to FIG. 1B. FIG. 1B is a cross-sectional side view of another conventional organic electro-luminescence device 20. The difference between the organic electro-luminescence device 20 in FIG. 1B and the organic electro-luminescence device 10 in FIG. 1A is that the organic electro-luminescence device 20 further includes a hole blocking layer 22. The hole blocking layer 22 is disposed between the light emitting layer 19 and the electron transporting layer 21. The objective of the hole blocking layer 22 is to effectively block the hole from moving toward the cathode layer 25. As a result, the electron and the hole combine in the light emitting layer 19 effectively. Therefore, the problem of the organic electro-luminescence device 10 in FIG. 1 is alleviated. However, though the organic electro-luminescence device 20 alleviates the energy wasting problem of the organic electro-luminescence device 10 in FIG. 1, the hole blocking layer 22 is added into the organic electro-luminescence device 20. As a result, the manufacturing process of the organic electro-luminescence device 20 becomes more complicated.

Therefore, the objective of the invention is to provide an organic electro-luminescence device with a simpler manufacturing process, higher luminance, greater efficiency and more saturated color reproduction.

SUMMARY OF THE INVENTION

An objective of the present invention is to provide an organic electro-luminescence device for increasing luminance, efficiency and color reproduction.

Another objective of the present invention is to simplify the manufacturing process of an organic electro-luminescence device.

An organic electro-luminescence device is provided by the invention. The organic electro-luminescence device in order includes a substrate, the first electrode layer, a hole injecting layer, a hole transporting layer, a light emitting layer, an electron transporting layer, an electron injecting layer and the second electrode layer. The substrate is in the bottom, and the other layers are formed over the substrate in order. The second electrode layer is formed on the top. The electron transporting layer includes carbazole derivative and n-type material.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 2:
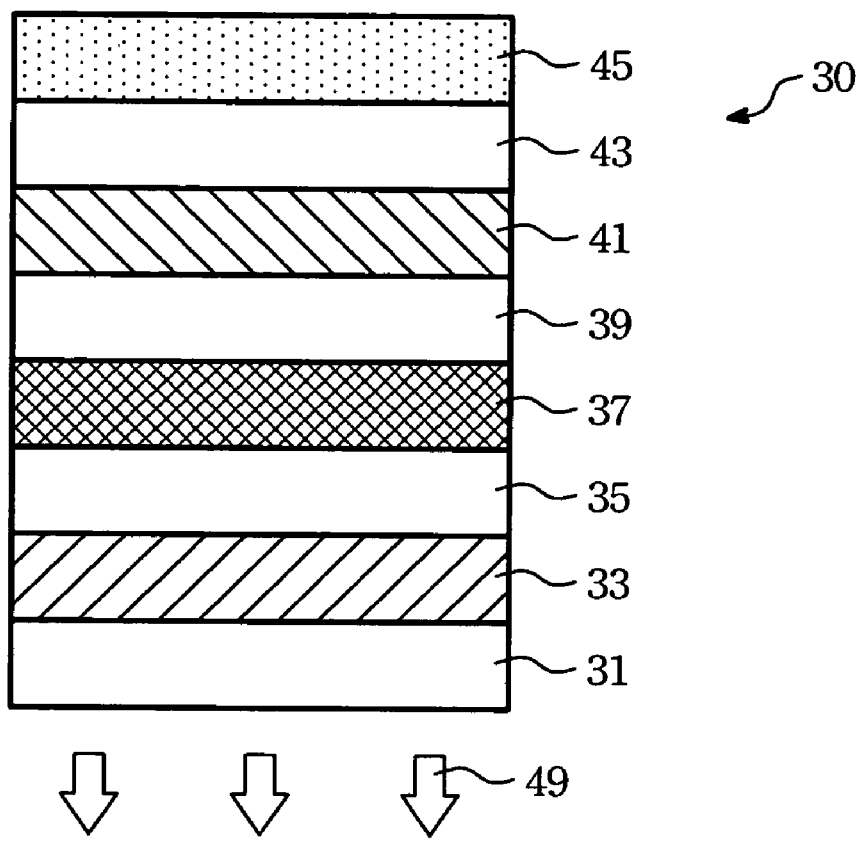
FIG. 2 illustrates a cross-sectional side view of an organic electro-luminescence device according to the invention.

Please refer to FIG. 2. A cross-sectional side view of an organic electro-luminescence device 30 according to the invention is illustrated in FIG. 2. When the organic electro-luminescence device 30 is manufactured, a substrate 31 is provided first. Next, the first electrode layer 33 is formed over the substrate 31. For example, the first electrode 33 is an anode layer. The anode electrode layer is made of a light-transmissible oxide. The light-transmissible oxide (or the first electrode 33) can be indium tin oxide (ITO), azo-compound, zinc oxide (ZnO), indium nitrogen (InN) or tin oxide ($SnO_2$). Also, the anode layer is preferably formed over the substrate 31 by sputter.

Then, the hole injecting layer 35 is formed over the first electrode layer 33. The hole injecting layer 35 includes a material selected from the group consisting of fluoro-carbohydrate, porphyrin derivative and p-doped diamine derivative. The hole injecting layer 35 is preferably formed over the first electrode layer 33 by vapor deposition process or sputter. For example, the porphyrin derivative is metallophthalocyanine derivative. The metallophthalocyanine derivative is preferably copper phthalocyanice. Afterward, the hole transporting layer 37 is formed over the hole injecting layer 35. For example, the hole transporting layer 37 is made of diamine derivative. The diamine derivative is preferably selected from the group consisting of N,N'-diphenyl-N,N'-bis(1-naphthyl)-

1,1'-biphenyl-4,4"-diamine (NPB) compound, N,N'-diphenyl-N,N'-di(3-methylphenyl)-1,1'-biphenyl-4,4'-diamine (TPD) compound, 4,4',4"-tris(N-(2-naphthyl)-N-phenylamino)-triphenylamine (2T-NATA) compound, NPB derivative, TPD derivative and 2T-NATA derivative. The thickness of the hole transporting layer 37 ranges from 50 Å to 5000 Å.

Subsequently, the light emitting layer 39 is formed over the hole transporting layer 37. The light emitting layer is preferably selected from the group consisting of 2,2'-dimethyl-4,4'-N,N'-dicarbazole-biphenyl (CDBP), Bis-(2-methyl-8-quinolinolate)-4-(phenylphenolato)-aluminium (BAlq), RD07, Ir-pytz and GD33. For example, the light emitting layer 39 is formed over the hole transporting layer 37 by vacuum vapor deposition process, ion vapor deposition process, or sublimation by linear source, such as organic vapor phase deposition (OVPD), ink-jet printing (IJP) or laser-induced thermal imaging (LITI). The light emitting layer 39 emits phosphorescent light. Moreover, the thickness of the light emitting layer 39 ranges from 50 Å to 2000 Å.

Then, the electron transporting layer 41 is formed over the light emitting layer 39. The electron transporting layer 41 includes at least carbazole derivative and n-type material. The ratio of the carbazole derivative and the n-type material ranges from 1:99 to 99:1. For example, the electron transporting layer 41 is formed over the light emitting layer 39 by vapor deposition process. The carbazole derivative is preferably selected from the group consisting of 4,4'-N,N'-dicarbazole-biphenyl (CBP), 2,2'-dimethyl-4,4'-N,N'-dicarbazole-biphenyl (CDBP), and 9-ethyl-3(triphenylsilyl)carbazole. The n-type material preferably comprises metallic oxide or organic metal salt. The metallic oxide has a cation preferably selected from the group consisting of lithium ion ($Li^+$), sodium ion ($Na^+$), potassium ion ($K^+$), cesium ion ($Cs^+$), magnesium ion ($Mg^{2+}$), calcium ion ($Ca^{2+}$) and barium ion ($Ba^{2+}$). The metallic oxide has a anion preferably selected from the group consisting of oxygen ion ($O_2^-$), fluorine ion ($F^-$), chlorine ion ($Cl^-$), bromine ion ($Br^-$), iodine ion ($I^-$), carbonate ion ($CO_3^{2-}$) and nitrate ion ($NO_3^-$). A cation of the organic metal salt is preferably selected from the group consisting of lithium ion ($Li^+$), sodium ion ($Na^+$), potassium ion ($K^+$), cesium ion ($Cs^+$), magnesium ion ($Mg^{2+}$), calcium ion ($Ca^{2+}$) and barium ion ($Ba^{2+}$). An anion of the organic metal salt is preferably selected from the group consisting of an organic anion with the number of carbon under 30, an aliphatic organic anion and an aromatic organic anion.

Next, the electron injecting layer 43 is formed over the electron transporting layer 41. The electron injecting layer 43 preferably includes alkali metal halide (such as lithium fluoride (LiF) compound, cesium fluoride (CsF) compound, or sodium fluoride (NaF) compound), alkali earth metal halide (such as calcium fluoride ($CaF_2$) compound), alkali metal oxide (such as lithium oxide ($Li_2O$) compound, cesium oxide ($Cs_2O$) compound or sodium oxide ($Na_2O$) compound), or metal carbonate (such as sodium carbonate ($Na_2CO_3$) compound, lithium carbonate ($Li_2CO_3$), or cesium carbonate ($Cs_2CO_3$)). For example, the electron injecting layer 43 is formed over the electron transporting layer 41 by thermal vapor deposition process. The thickness of the electron injecting layer 43 ranges from 1 Å to 3000 Å.

Then, the second electrode layer 45 is formed over the electron injecting layer 43. The second electrode layer 45 is preferably a cathode layer. The cathode layer includes aluminum with the property of reflecting. The second electrode layer 45 is preferably formed over the electron injecting layer 43 by sputter or vapor deposition process. Moreover, the second electrode layer 45 can also includes other reflective metal material, such as aluminum, magnesium, lithium or metal alloy.

Figure 1:
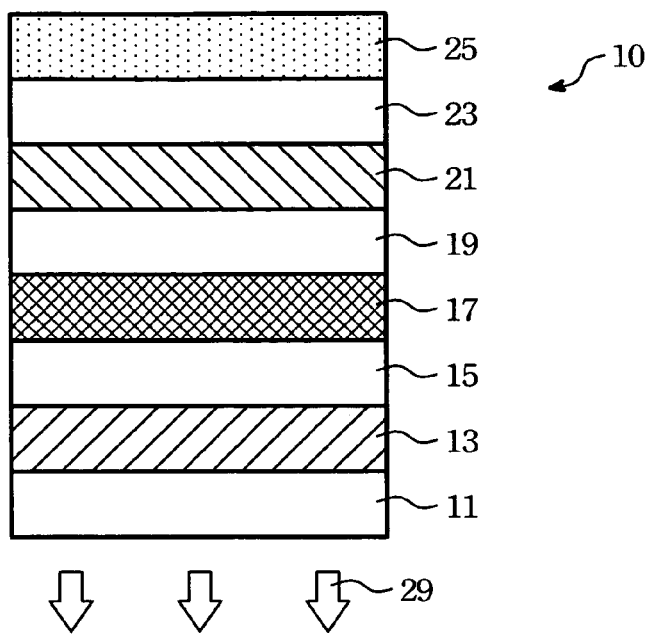
FIG. 1A is a cross-sectional side view of a conventional organic electro-luminescence device.
FIG. 1B is a cross-sectional side view of another conventional organic electro-luminescence device.
Figure 1:
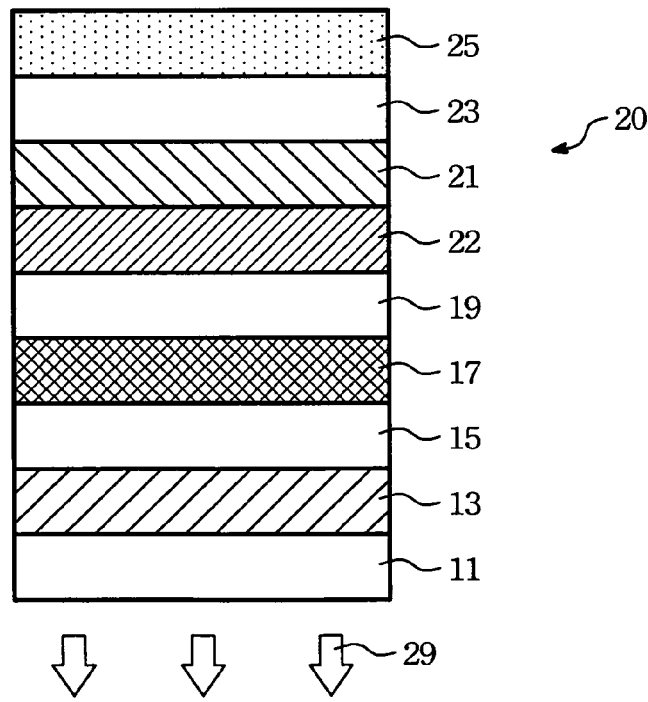

As stated above, the material of the electron transporting layer 41 in the organic electro-luminescence device 30 of the invention has enough energy level to block the hole from moving toward the second electrode layer 45. Compared to the conventional organic electro-luminescence device 20 in FIG. 1B, the organic electro-luminescence device 30 of the invention does not include an extra hole blocking layer 22 (as shown in FIG. 1B) to block the hole. As a result, the manufacturing process of the organic electro-luminescence device 30 is simplified. Additionally, compared to the conventional organic electro-luminescence device 10 in FIG. 1, the organic electro-luminescence device 30 of the invention alleviates the problem of energy wasting resulted from the movement of the hole.

In addition to the above advantages, the organic electro-luminescence device 30 of the invention improves luminance, luminous efficiency and color reproduction greatly. Three organic electro-luminescence devices with blue light, green light and red light respectively according to the embodiments of the invention are illustrated as follow.

Figure 3A:
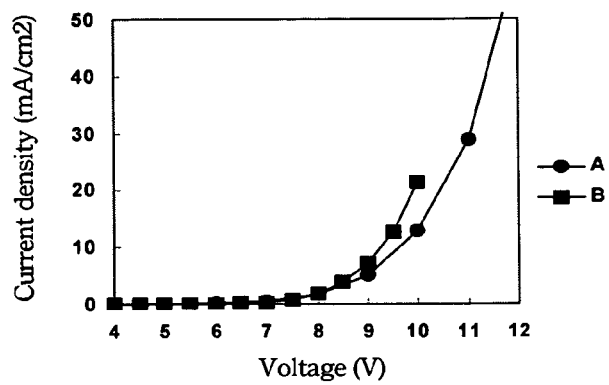
FIG. 3a to FIG. 3d show comparison of different efficiency between the conventional organic electro-luminescence device in FIG. 1B and the organic electro-luminescence device of the invention in FIG. 2.
Figure 3B:
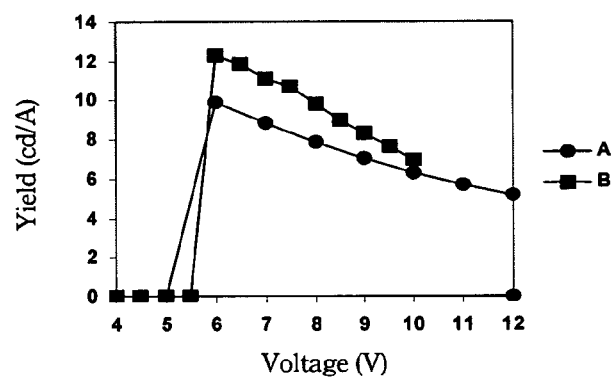
Figure 3C:
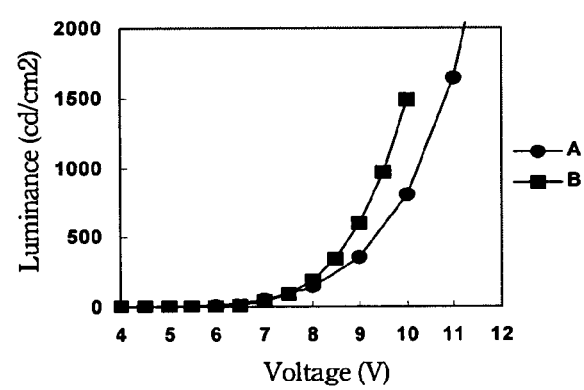
Figure 3D:
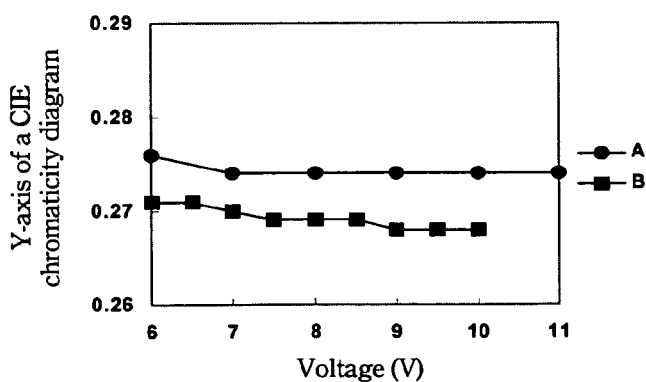

Take blue light for example. Please refer to FIG. 3a to FIG. 3d. FIG. 3a to FIG. 3d show comparison of different efficiency between the conventional organic electro-luminescence device 20 in FIG. 1B and the organic electro-luminescence device 30 of the invention in FIG. 2. The conventional organic electro-luminescence device 20 in order includes an anode layer 13, a hole injecting layer 15, a hole transporting layer 17, a light emitting layer 19, a hole blocking layer 22, an electron transporting layer 21, an electron injecting 23 and a cathode layer 25. The material of all the layers in order includes indium tin oxide (ITO), copper phthalocyanine (CuPC), N,N'-diphenyl-N,N'-bis(1-naphthyl)-1,1'-biphenyl-4,4"-diamine (NPB) derivative, Blue EML, Bis-(2-methyl-8-quinolinolate)-4-(phenylphenolato)-aluminium (BAlq), Alq, lithium fluoride (LiF) and aluminum (Al). The organic electro-luminescence device 30 of the invention in order includes the first electrode layer 33, a hole injecting layer 35, a hole transporting layer 37, a light emitting layer 39, an electron transporting layer 41, an electron injecting layer 43 and the second electrode layer 45. The material of all the layers in order includes indium tin oxide (ITO), copper phthalocyanine (CuPC), N,N'-diphenyl -N,N'-bis(1-naphthyl)-1,1'-biphenyl-4,4"-diamine (NPB) derivative, Blue EML, CDBP: 30% cesium fluoride (CsF), lithium fluoride (LiF) and aluminum (Al). As shown in FIG. 3a, FIG. 3b, FIG. 3c and FIG. 3d, the reference A indicates the efficiency generated by the conventional organic electro-luminescence device 20. The reference B indicates the efficiency generated by the organic electro-luminescence device 30 of the invention. FIG. 3a shows generated current density with different voltage. FIG. 3b shows generated luminous yield with different voltage. FIG. 3c shows generated luminance with different voltage. FIG. 3d shows y-axis of a CIE chromaticity diagram of blue light. As shown in FIG. 3a, FIG. 3b and FIG. 3c, the organic electro-luminescence device 30 of the invention has better luminous efficiency and higher luminance than the conventional organic electro-luminescence device 20. As shown in FIG. 3d, as to the y-axis of the CIE chromaticity diagram, the lower the value of the y-axis is, the higher the saturation of the blue light is. Therefore, compared to the conventional organic electro-luminescence device 20, the organic electro-luminescence device 30 of the invention has better saturation.

Figure 4:
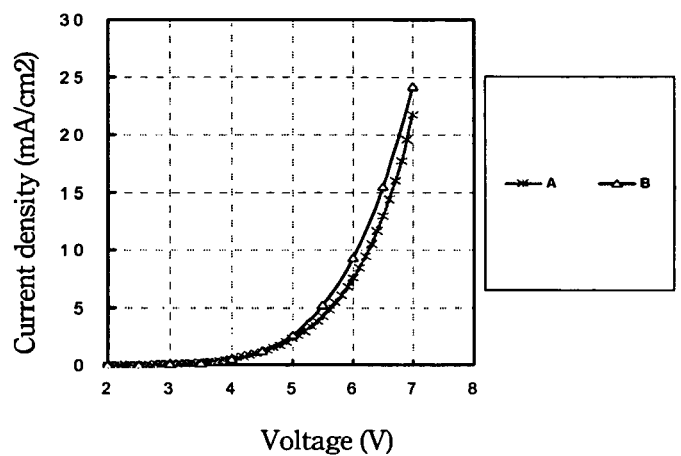
FIG. 4 shows comparison of efficiency between the conventional organic electro-luminescence device in FIG. 1B and the organic electro-luminescence device of the invention in FIG. 2.

Take green light for example. Please refer to FIG. 4. FIG. 4 shows comparison of efficiency between the conventional organic electro-luminescence device 20 in FIG. 1B and the organic electro-luminescence device 30 of the invention in FIG. 2. The structures of the device 20 and the device 30 with green light are the same those with blue light. The material of all the layers in the device 20 in order includes indium tin oxide (ITO), copper phthalocyanine (CuPC), N,N'-diphenyl-N,N'-bis(1-naphthyl)-1,1'-biphenyl-4,4"-diamine (NPB) derivative, Green EML, Bis-(2-methyl-8-quinolinolate)-4-(phenylphenolato)-aluminium (BAlq), Alq, lithium fluoride (LiF) and aluminum (Al). The material of all the layers in the device 30 in order includes indium tin oxide (ITO), copper phthalocyanine (CuPC), N,N'-diphenyl-N,N'-bis(1-naphthyl)-1,1'-biphenyl-4,4"-diamine (NPB) derivative, Green EML, CDBP: 20% cesium fluoride (CsF), lithium fluoride (LiF) and aluminum (Al). As shown in FIG. 4, the reference A indicates the efficiency generated by the conventional organic electro-luminescence device 20. The reference B indicates the efficiency generated by the organic electro-luminescence device 30 of the invention. FIG. 4 shows current density with different voltage. As shown in FIG. 4, the device 30 of the invention has better luminance than the conventional device 20.

Figure 5:
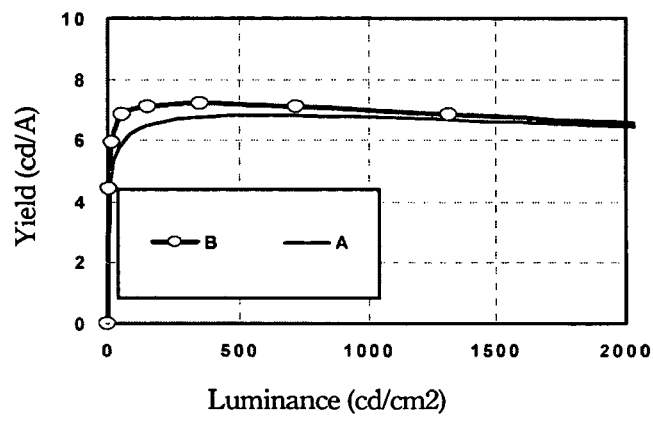
FIG. 5 shows comparison of efficiency between the conventional organic electro-luminescence device in FIG. 1B and the organic electro-luminescence device of the invention in FIG. 2.

Take red light for example. Please refer to FIG. 5. FIG. 5 shows comparison of efficiency between the conventional organic electro-luminescence device 20 in FIG. 1B and the organic electro-luminescence device 30 of the invention in FIG. 2. The structures of the device 20 and the device 30 with red light are the same those with blue light. The material of all the layers in the device 20 in order includes indium tin oxide (ITO), copper phthalocyanine (CuPC), N,N'-diphenyl-N,N'-bis(1-naphthyl)-1,1'-biphenyl-4,4"-diamine (NPB) derivative, Red EML, Bis-(2-methyl-8-quinolinolate)-4-(phenylphenolato)-aluminium (BAlq), Alq, lithium fluoride (LiF) and aluminum (Al). The material of all the layers of the device 30 in order includes indium tin oxide (ITO), copper phthalocyanine (CuPC), N,N'-diphenyl-N,N'-bis(1-naphthyl)-1,1'-biphenyl-4,4"-diamine (NPB) derivative, Red EML, CBP: 20% cesium fluoride (CsF), lithium fluoride (LiF) and aluminum (Al). As shown in FIG. 5, the reference A indicates the efficiency generated by the conventional organic electro-luminescence device 20. The reference B indicates the efficiency generated by the organic electro-luminescence device 30 of the invention. FIG. 5 shows luminous yield with different luminance. As shown in FIG. 5, the device 30 of the invention has better luminous efficiency and luminance than the conventional device 20.

The organic electro-luminescence device of the invention is able to effectively block the hole from moving toward the second electrode layer without an extra hole blocking layer. As a result, the problem of energy wasting is alleviated. Also, the manufacturing process of the organic electro-luminescence device is simplified. Furthermore, the organic electro-luminescence device of the invention improves the luminance, luminous efficiency and color reproduction greatly. Moreover, the application level of the organic electro-luminescence device of the invention is promoted.

With the example and explanations above, the features and spirits of the invention are hopefully well described. Those skilled in the art will readily observe that numerous modifications and alterations of the device may be made while retaining the teaching of the invention. Accordingly, the above disclosure should be construed as limited only by the metes and bounds of the appended claims.

We claim:
1. An organic electro-luminescence device, comprising:
a substrate;
a first electrode layer formed over the substrate;
a hole injecting layer formed over the first electrode layer;
a hole transporting layer formed over the hole injecting layer, wherein the hole transporting layer is made of diamine derivative;
a light emitting layer formed over the hole transporting layer;
an electron transporting layer, formed over the light emitting layer, having carbazole derivative and n-type material, wherein the carbazole derivative is selected from the group consisting of 2,2'-dimethyl-4,4'-N,N'-dicarbazole-biphenyl (CDBP), and 9-ethyl-3(triphenylsilyl) carbazole;
an electron injecting layer formed over the electron transporting layer; and
a second electrode layer formed over the electron injecting layer.

2. The organic electro-luminescence device of claim 1, wherein the hole injecting layer includes a material selected from the group consisting of fluoro-carbohydrate, porphyrin derivative, and p-doped diamine derivative.

3. The organic electro-luminescence device of claim 2, wherein the porphyrin derivative is metallophthalocyanine derivative.

4. The organic electro-luminescence device of claim 3, wherein the metallophthalocyanine derivative is copper phthalocyanine.

5. The organic electro-luminescence device of claim 1, wherein the diamine derivative is selected from the group consisting of N,N'-diphenyl-N,N'-bis (1-naphthyl)-1,1'-biphenyl-4,4"-diamine (NPB), N,N'-diphenyl-N,N'-di(3-methylphenyl)-1,1'-biphenyl-4,4'-diamine (TPD), 4,4',4"-tris(N-(2-naphthyl)-N-phenyl-amino)-triphenylamine (2T-NATA) compound, NPB derivative, TPD derivative, and 2T-NATA derivative.

6. The organic electro-luminescence device of claim 1, wherein the n-type material comprises metallic oxide or organic metal salt.

7. The organic electro-luminescence device of claim 6, wherein the metallic oxide has a cation selected from the group consisting of lithium ion ($Li^+$), sodium ion ($Na^+$), potassium ion ($K^+$), cesium ion ($Cs^+$), magnesium ion ($Mg^{2+}$), calcium ion ($Ca^{2+}$) and barium ion ($Ba^{2+}$), and an anion of the metallic oxide selected from the group consisting of oxygen ion ($O^{2-}$), fluorine ion ($F^-$), chlorine ion ($Cl^-$), bromine ion ($Br^-$), iodine ion ($I^-$), carbonate ion ($CO_3^{2-}$), and nitrate ion ($NO_3^-$).

8. The organic electro-luminescence device of claim 6, wherein the organic metal salt has a cation selected from the group consisting of lithium ion ($Li^+$), sodium ion ($Na^+$), potassium ion ($K^+$), cesium ion ($Cs^+$), magnesium ion ($Mg^{2+}$), calcium ion ($Ca^{2+}$) and barium ion ($Ba^{2+}$), and an anion of the organic metal salt selected from the group consisting of an organic anion with the number of carbon under 30, an aliphatic organic anion, and an aromatic organic anion.

9. The organic electro-luminescence device of claim 1, wherein the ratio of the carbazole derivative and the n-type material ranges from 1:99 to 99:1.

10. The organic electro-luminescence device of claim 1, wherein the electron injecting layer includes alkali metal halide, alkaline earth metal halide, alkali metal oxide, or metal carbonate.

11. The organic electro-luminescence device of claim 1, wherein the first electrode layer is made of a light-transmissible oxide.

12. The organic electro-luminescence device of claim 1, wherein the first electrode layer is made of indium tin oxide (ITO), azo-compound, zinc oxide (ZnO), indium nitrogen (InN), or tin oxide ($SnO_2$).

13. The organic electro-luminescence device of claim 1, wherein the second electrode layer comprises aluminum.

14. The organic electro-luminescence device of claim 1, wherein the light emitting layer emits phosphorescent light.

15. An organic electro-luminescence device, comprising:
an indium tin oxide layer, a copper phthalocyanine layer, a N,N'-diphenyl-N,N'-bis(1-naphthyl)-1,1'-biphenyl-4,4"-diamine derivative layer, a light emitting layer, a layer consisting of 2,2'-dimethyl-4,4'-N,N'-dicarbazole-biphenyl (CDBP) and cesium fluoride, a lithium fluoride layer and an aluminum layer in order.

16. The organic electro-luminescence device of claim 15, wherein said light emitting layer is a blue light emitting layer.

17. The organic electro-luminescence device of claim 15, wherein a ratio of CDBP and cesium fluoride ranges from 1:0.2 to 1:0.3.

* * * * *